United States Patent
Hong et al.

(10) Patent No.: US 12,087,346 B2
(45) Date of Patent: Sep. 10, 2024

(54) MEMORY DEVICE

(71) Applicant: SAMSUNG ELECTRONICS CO., LTD., Suwon-si (KR)

(72) Inventors: Seung Ki Hong, Incheon (KR); Seung Jun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 17/750,775

(22) Filed: May 23, 2022

(65) Prior Publication Data

US 2023/0060358 A1 Mar. 2, 2023

(30) Foreign Application Priority Data

Aug. 26, 2021 (KR) .................. 10-2021-0113226

(51) Int. Cl.
*G11C 11/40* (2006.01)
*G11C 11/406* (2006.01)
*G11C 11/4093* (2006.01)

(52) U.S. Cl.
CPC ... *G11C 11/40618* (2013.01); *G11C 11/40611* (2013.01); *G11C 11/40615* (2013.01); *G11C 11/4093* (2013.01)

(58) Field of Classification Search
CPC ......... G11C 11/40618; G11C 11/40611; G11C 11/40615; G11C 11/4093; G11C 11/40603; G11C 11/4087; G11C 11/4091
See application file for complete search history.

(56) References Cited

U.S. PATENT DOCUMENTS

| | | |
|---|---|---|
| 9,286,964 B2 | 3/2016 | Halbert et al. |
| 9,524,771 B2 | 12/2016 | Sriramagiri et al. |
| 9,805,783 B2 | 10/2017 | Ito et al. |
| 10,127,974 B2 | 11/2018 | Kim et al. |
| 10,424,362 B2 | 9/2019 | Nakaoka |
| 10,580,475 B2 | 3/2020 | Morohashi et al. |
| 10,861,519 B2 | 12/2020 | Jones et al. |
| 2020/0211634 A1* | 7/2020 | Ishikawa ........... G11C 11/40615 |
| 2021/0109577 A1 | 4/2021 | Mandava et al. |

* cited by examiner

*Primary Examiner* — Xiaochun L Chen
(74) *Attorney, Agent, or Firm* — Sughrue Mion, PLLC

(57) ABSTRACT

A memory device includes a memory cell array, a row select circuit, a refresh controller and a memory control logic. The memory cell array includes memory cells arranged in rows and columns. The row select circuit is connected to the rows. The refresh controller controls the row select circuit to apply a refresh operating voltage to one or more rows. The memory control logic decodes a command received from a memory controller and outputs a refresh command and external refresh address information. The refresh controller controls the row select circuit to perform one of an external refresh operation and an internal refresh operation, based on the refresh command that is output from the memory controller and based on whether a first row-hammering row address of the internal refresh operation is identical with a second row-hammering row address of the external refresh operation.

20 Claims, 10 Drawing Sheets

//MEMORY DEVICE

CROSS-REFERENCE TO RELATED APPLICATION

This application claims priority from Korean Patent Application No. 10-2021-0113226 filed on Aug. 26, 2021 in the Korean Intellectual Property Office, and all the benefits accruing therefrom under 35 U.S.C. 119, the contents of which are herein incorporated by reference in its entirety.

BACKGROUND

The present disclosure relates to a memory device.

A semiconductor memory device for storing data may be roughly divided into a volatile memory device and a non-volatile memory device. In a volatile memory device such as a dynamic random access memory (DRAM) in which data is stored via charging or discharging a cell capacitor, the stored data is maintained while power is applied, while the stored data is lost when the power is turned off. To the contrary, the non-volatile memory device may store data therein even when the power is turned off. The volatile memory device is mainly used as a main memory of a computer, while the non-volatile memory device is used as a large-capacity memory for storing programs and data in a wide range of devices such as computers and portable communication devices.

In the volatile memory device such as DRAM, cell charges stored in the memory cell may be lost due to leakage current. Before the cell charges are lost and thus data is completely damaged, the charges must be recharged to the memory cell. This recharge of the cell charges is referred to as a refresh operation. This refresh operation is repeatedly performed before the cell charges are lost.

SUMMARY

It is an aspect to provide a memory device which gradually shrinks (has gradually increasing integration) and improved data reliability against a row-hammering phenomenon, and a method of operating the memory device.

According to an aspect of one or more embodiments, there is provided a memory device comprising a memory cell array including a plurality of memory cells arranged in a plurality of rows and a plurality of columns; a row select circuit connected to the plurality of rows; a refresh controller configured to control the row select circuit to apply a refresh operating voltage to at least one row; and a memory control logic configured to decode a command received from a memory controller and to output a refresh command and external refresh address information, wherein the refresh controller controls the row select circuit to perform one of an external refresh operation and an internal refresh operation, based on the refresh command that is output from the memory controller and based on whether a first row-hammering row address of the internal refresh operation is identical with a second row-hammering row address of the external refresh operation.

According to an aspect of one or more embodiments, there is provided a memory device comprising a bank array including memory cells; a bank row select circuit that applies an operating voltage to each of rows of the bank array; and a memory control logic configured to control the operating voltage, wherein the memory control logic is configured to determine whether to perform an internal refresh operation, and detect an internal row-hammering row address, based on operation information about each of the rows; and when refresh address information and a refresh command is received from a memory controller, compare an external row-hammering row address based on the refresh address information with the internal row-hammering row address and, when the external row-hammering row address is identical with the internal row-hammering row address, control the bank row select circuit to perform an external refresh operation according to the refresh command, based on the external row-hammering row address.

According to an aspect of one or more embodiments, there is provided a memory device comprising a plurality of bank arrays; a plurality of bank row select circuits connected to the plurality of bank arrays, respectively, wherein each of the plurality of bank row select circuits is connected to a corresponding bank array on a row basis and applies an operation voltage thereto; and a memory control logic configured to control the applied operating voltage based on commands from a memory controller or based on an internal operation result of the memory control logic, wherein when an external row-hammering row address on which an external refresh operation is to be performed based on a refresh command among the commands is identical with an internal row-hammering row address on which an internal refresh operation is to be performed based on the internal operation result of the memory control logic, the memory control logic is configured to perform only the external refresh operation.

BRIEF DESCRIPTION OF DRAWINGS

The above and other aspects will become more apparent by describing in detail embodiments thereof with reference to the attached drawings, in which.

DETAILED DESCRIPTIONS

Figure 1:
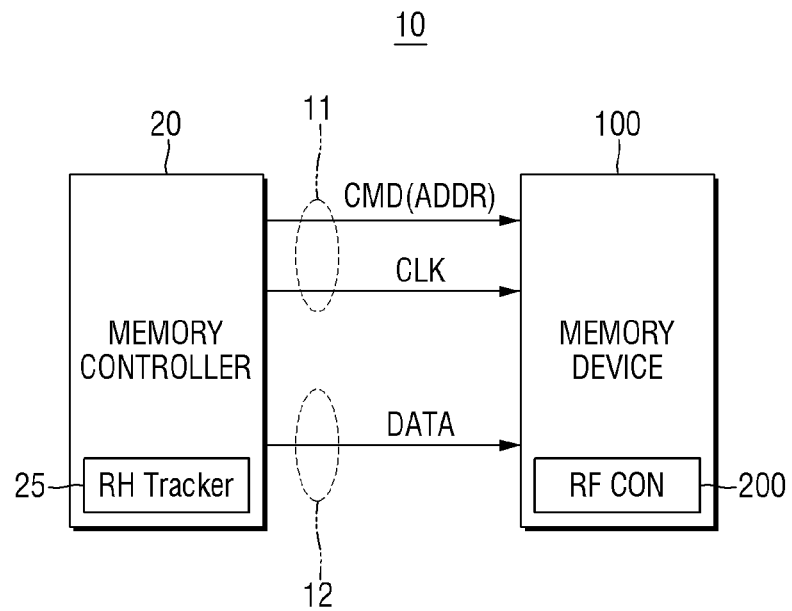
FIG. 1 is a block diagram showing a memory system according to some embodiments.

For simplicity and clarity of illustration, elements in the drawings are not necessarily drawn to scale. A shape, a size, a ratio, an angle, a number, etc. disclosed in the drawings for illustrating an embodiments of the present disclosure are exemplary, and the present disclosure is not limited thereto. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. to the phrase "C to D" means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a "first" element, component, region, layer or section described below could be termed a "second" element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events, such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented for example, rotated 90 degrees or at other orientations, and the spatially relative descriptors used herein should be interpreted accordingly.

With development of process technology such as increase in an integration density, a spacing between cells of a dynamic random access memory (DRAM) is gradually becoming smaller. In addition, due to the reduction in the spacing between the cells, interference by an adjacent cell or word-line is becoming an increasingly important data reliability factor. Even when the interference is concentrated on a specific cell, it is difficult to restrict access to a specific address in the random access memory such as a DRAM. Therefore, disturbance with a specific cell may occur, and this disturbance thus also affects refresh characteristics of the specific cell.

In a volatile memory device such as the dynamic random access memory (DRAM), data is determined based on charges stored in a capacitor. However, because the charges stored in the capacitor may leak in various forms over time, the volatile memory device periodically performs a refresh operation. As a manufacturing process of manufacturing the memory device is scaled down and thus a spacing between word-lines becomes narrower, an effect of voltage distribution of one word-line on charges of a memory cell connected to an adjacent word-line thereto has been increased. When one word-line is intensively accessed, a row-hammering phenomenon occurs in which, due to a voltage of an activated state of one word-line, data stored in memory cells connected to an adjacent word-line thereto are lost has occurred. The present disclosure provides a memory device with improved data reliability by reducing the row-hammering phenomenon in the memory device and a method of operating the same.

As used herein, a term "row-hammering row" refers to a word-line, that is, a row that is intensively accessed in a memory cell to induce the row-hammering phenomenon. As used herein, a term "victim row" refers to at least one row adjacent to an address of the row-hammering row, that is, a row address where data is lost due to an operating (activating) voltage of the intensively accessed row.

A purpose of the present disclosure is to provide a memory device which gradually shrinks (has gradually increasing integration) and improved data reliability against a row-hammering phenomenon, and a method of operating the memory device.

Purposes according to the present disclosure are not limited to the above-mentioned purpose. Other purposes and advantages according to the present disclosure that are not mentioned may be understood based on following description, and may be more clearly understood based on embodiments according to the present disclosure. Further, it will be easily understood that the purposes and advantages according to the present disclosure may be realized using means shown in the claims and combinations thereof.

Hereinafter, various embodiments will be described with reference to the accompanying drawings.

Figure 2:
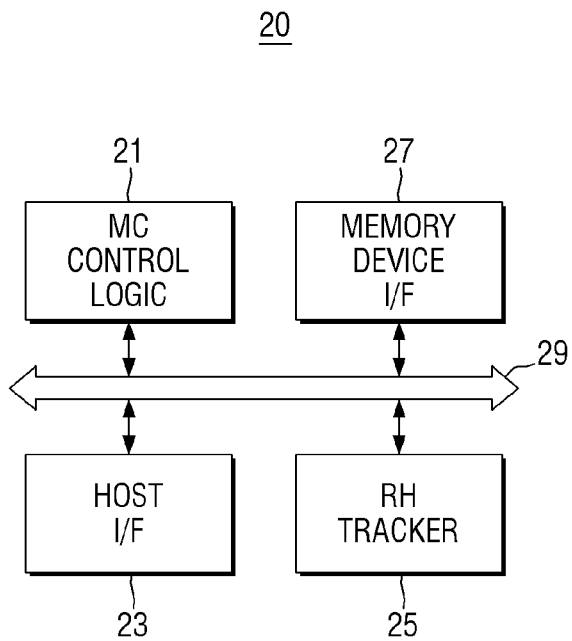
FIG. 2 is a block diagram showing an example of a memory controller that is included in the memory system of FIG. 1, according to some embodiments.
Figure 3:
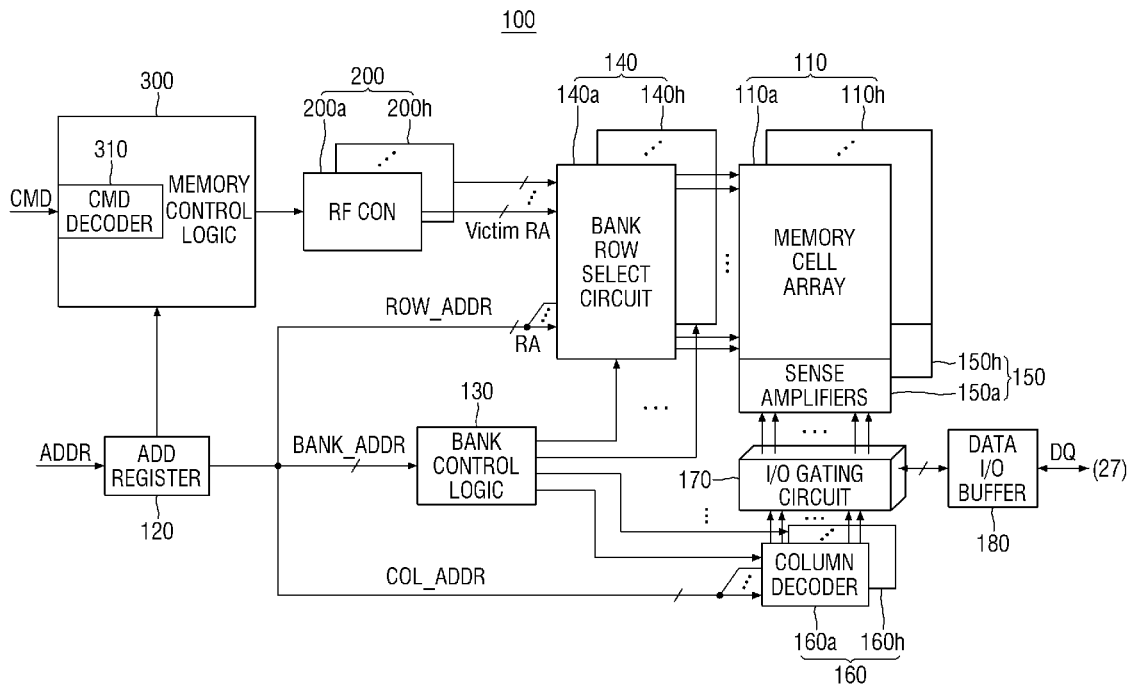
FIG. 3 is a block diagram showing an example of a memory device included in the memory system of FIG. 1, according to some embodiments.

FIG. 1 is a block diagram showing a memory system according to some embodiments. FIG. 2 is a block diagram showing an example of a memory controller that is included in the memory system of FIG. 1, according to some embodiments. FIG. 3 is a block diagram showing an example of a memory device included in the memory system of FIG. 1, according to some embodiments.

Referring to FIG. 1, a memory system 10 includes a memory controller 20 and a memory device 100. Each of the memory controller 20 and the memory device 100 includes an interface for mutual communication with each other. The interfaces may be connected to each other through a control bus 11 for transmitting a command CMD, an address ADDR, a clock signal CLK, etc. and a data bus 12 for transmitting data. The command CMD may include the address ADDR.

The memory controller 20 may generate a command signal CMD for controlling the memory device 100. Under control of the memory controller 20, data DATA may be written into the memory device 100 or data DATA may be read-out from the memory device 100. The memory device 100 may transmit the data read-out from the memory cell and state information of the memory device via the data bus 12. According to some embodiments, the memory controller 20 may further include a row-hammering (RH) tracker 25 for monitoring a row-hammering state of the memory device 100. For example, the row-hammering (RH) tracker 25 may determine, based on the commands and the address information transmitted to the memory device 100, whether a row-hammering phenomenon occurs, and the memory controller 20 may transmit a refresh command and address information to the memory device 100 based on the determination result. The memory controller 20 may receive information about an internal row-hammering row address on which an internal refresh operation is to be performed, as discussed further below, and determine whether to transmit the refresh command, based on the information about the internal row-hammering row address. According to some embodiments, the memory device 100 may further include a refresh controller (RF CON) 200, which will be described in more detail later.

Referring to FIG. 2, according to some embodiments, the memory controller 20 may include a memory controller (MC) control logic 21, a host interface (I/F) 23, the row-hammering (RH) tracker 25, and a memory device interface (I/F) 27 communicatively coupled together via a bus 29.

When the memory controller 20 receives a request of an access to the memory device 100 from an external device (e.g., an application processor (not shown)) through the host interface (I/F) 23, the memory controller 20 determines a command CMD related to the access request using the memory controller control logic 21. The memory controller 20 may transmit the command CMD to the memory device 100 to control all operations of the memory device 100.

When the memory controller 20 transmits and receives data to and from the memory device 100, the row-hammering tracker 25 may monitor a state of the memory device 100, and may track whether to perform a refresh operation on at least one row of the memory device 100 or at least one bank thereof based on a state of the memory device 100. For example, the row-hammering tracker 25 may determine whether row-hammering has occurred in each bank array based on the command and address information transmitted to the memory device 100, and may transmit, to the memory device 100, a refresh command on address information accessed the number of times larger than a preset number of times, or on any address as preset, and the address information.

According to some embodiments, the row-hammering tracker 25 may check the state of the memory device 100 in association manner with the memory controller 20 itself. For example, the row-hammering tracker 25 may count the number of times the command is transmitted from the memory controller 20 to the memory device 100, may identify a type of the command, and may count the number of accesses to information at a specific address in the memory device 100, and thus may monitor a state in a memory cell array in the memory device 100.

According to some embodiments, the row-hammering tracker 25 may check the state of the memory device 100 based on memory cell state information transmitted from the memory device 100. For example, the memory cell state information may include information about an internal row-hammering row address on which an internal refresh operation is to be performed by the memory device 100 itself.

The memory device interface (I/F) 27 may transmit data to be written to the memory device 100 to the memory device 100 or receive data read from the memory device 100 therefrom. For example, the memory device 100 may transmit a read data strobe signal RDQS and a data signal DQ via the memory device interface 27. The memory controller 20 may transmit a clock signal CK, command/address signals C/A, a write data strobe signal WDQS, and a data signal DQ to the memory device 100 via the memory device interface 27. The memory device 100 may generate an internal control signal based on the signals provided from the memory controller 100. The memory cell array 110 may store therein data DATA or output the stored data DATA according to an internal control signal.

Referring to FIG. 3, according to some embodiments, the memory device 100 may include a memory control logic 300, an address (ADD) register 120, a bank control logic 130, a bank row select circuit 140, a column decoder 160, a memory cell array 110, a sense amplifier 150, an input/output (I/O) gating circuit 170, a data input/output (I/O) buffer 180, and the refresh controller (RF CON) 200.

The memory cell array 110 may include a plurality of memory banks, that is, a plurality of bank arrays 110$a$ to 110$h$. The bank row select circuit 140 may include a plurality of bank row select circuits 140$a$ to 140$h$ respectively connected to the plurality of bank arrays 110$a$ to 110$h$. The column decoder 160 may include a plurality of bank column decoders 160$a$ to 160$h$ connected to the plurality of bank arrays 110$a$ to 110$h$, respectively. The sense amplifier 150 may include a plurality of sense amplifiers 150$a$ to 150$h$ respectively connected to the plurality of bank arrays 110$a$ to 110$h$.

Each of the bank arrays 110$a$ to 110$h$ may include a plurality of blocks BLK0 to BLKn. Each block BLK may include a plurality of memory cells. The memory cell array 110 may include a plurality of memory cells. For example, the memory cell may be embodied as a Dynamic Random Access Memory (DRAM) cell. In this case, the memory device interface 27 may perform communication based on one of standards: DDR (Double Data Rate), LPDDR (low power double data rate), GDDR (Graphics Double Data Rate), Wide I/O, HBM (High Bandwidth Memory), HMC (Hybrid Memory Cube), etc.

The memory device 100 may receive the command CMD and the address ADDR based on the clock signal CK.

The address (ADD) register 120 may receive the address ADDR from the memory controller 20. The address ADDR may include a bank address BANK_ADDR, a row address ROW_ADDR, and a column address COL_ADDR. The address register 120 may convert the address ADDR into an internal address of the memory device 100. For example, the address register 120 may provide the bank address BANK_ADDR to the bank control logic 130 and may provide the row address ROW_ADDR to the bank row select circuit 140, and may provide the column address COL_ADDR to the column decoder 160.

The bank control logic 130 may generate bank control signals in response to the bank address BANK_ADDR. In response to the bank control signals, a bank row select circuit corresponding to the bank address BANK_ADDR among the plurality of bank row select circuits 140$a$ to 140$h$ may be activated, and a bank column decoder corresponding to the bank address BANK_ADDR among the plurality of bank column decoders 160$a$ to 160$h$ may be activated.

The row addresses ROW_ADDR output from the address register 120 may be applied to the bank row select circuits 140$a$ to 140$h$, respectively. A bank row select circuit activated by the bank control logic 130 among the bank row select circuits 140$a$ to 140$h$ may decode the row address ROW_ADDR and thus may activate a word-line corresponding to the row address and thus may apply an operating voltage thereto. For example, the activated bank row select circuit may apply a word-line driving voltage on each row basis corresponding to the row address. For example, the activated bank row select circuit 140$a$ may apply an activation driving voltage to a word-line of an active row based on an active command, and may apply a refresh driving voltage to a word-line of a row-hammering row based on a refresh command. According to some embodiments, the active row address may be a row based on address information transmitted along with the active command from the memory controller to the memory device. Alternatively, according to some embodiments, the active row address may be a row of an active address to which the active command is transmitted from the memory controller to the memory device and which may be determined by the memory device itself to execute the active command. In this connection, the active command may be a command for a data read operation, a write operation, or an erase operation in the memory cell. The refresh command may be a command to perform the refresh operation on at least one of the row-hammering row or the victim row.

The column decoder 160 may include a column address latch. The column address latch may receive the column address COL_ADDR from the address register 120 and may temporarily store therein the received column address COL_ADDR. Further, the column address latch may gradually increase the received column address COL_ADDR in a burst mode. The column address latch may apply the temporarily stored or gradually increased column addresses COL_ADDR to the bank column decoders 160$a$ to 160$h$, respectively.

A bank column decoder activated by the bank control logic 130 among the bank column decoders 160$a$ to 160$h$ may activate the sense amplifier corresponding to the bank address BANK_ADDR and the column address COL_ADDR through the input/output gating circuit 170.

The input/output (I/O) gating circuit 170 may include circuits for gating input/output data, an input data mask logic, read-out data latches for storing therein data output from the bank arrays 110$a$ to 110$h$, and write-in drivers for writing data into the bank array 110$a$ to 110$h$.

Data DQ to be read out from one of the bank arrays 110$a$ to 110$h$ may be detected by one of the sense amplifiers 150$a$ to 150$h$ corresponding to the one bank array, and may be stored in the read-out data latches. The data DQ stored in the read-out data latches may be provided to the memory controller through the data input/output buffer 180. Data DQ to be written into one of the bank arrays 110$a$ to 110$h$ may be provided to the data input/output buffer 180 from the memory controller. The data DQ provided to the data input/output buffer 180 may be written into said one bank array through the write-in drivers.

The refresh controller (RF CON) 200 may control the bank row select circuit 140 of the memory device 100 to perform the refresh operation. For example, the refresh controller 200 may control 100 the bank row select circuit of the memory device 100 to perform the refresh operation on one bank array 110$a$ activated by the bank control logic 130 based on a result of determining an external refresh operation or an internal refresh operation due to the refresh command from the memory controller 20. According to some embodiments, the refresh controller 200 may include a plurality of refresh controllers 200*a* to 200*h* corresponding respectively to the bank row select circuits 140*a* to 140*h*.

According to some embodiments, the refresh controller 200 may control the bank row select circuit 140 to extract at least one victim row adjacent to an address of the row-hammering row RH Add for the external refresh operation or the internal refresh operation, and to perform the refresh operation on an address of the victim row. For example, the bank row select circuit 140 may apply a refresh voltage to the victim row address.

The memory control logic 300 may control all operations of the memory device 100. According to some embodiments, the memory control logic 300 may generate first control signals to perform an activation operation, for example, a write-in operation or a read-out operation to or from the memory device 100. According to some embodiments, the memory control logic 300 may control the refresh controller 200 using a refresh controller control signal such that the refresh operation is performed on the memory device 100.

FIG. 3 shows the refresh controller 200 and the memory control logic 300 separately. That is, as in the illustrated embodiment of FIG. 3, the refresh controller 200 and the memory control logic 300 may be implemented as independent components. However, alternatively, according to some embodiments, the memory control logic 300 may be implemented to include the refresh controller 200.

A command (CMD) decoder 310 may receive the command signal among the command/address signals and decode the command signal into an internal command of the memory device 100. The command decoder 310 may decode the command CMD received from the memory controller 20 to generate the internal command.

According to some embodiments, upon receiving a refresh command REF CMD from the memory controller 20, the memory control logic 300 may generate a refresh controller control signal for the external refresh operation.

Although the memory control logic 300 and the address register 120 are shown as separate components in FIG. 3, the memory control logic 300 and the address register 120 may be implemented as an inseparable and one component. Further, FIG. 3 shows that the command CMD and the address ADDR are provided as separate signals, respectively. However, as suggested in a LPDDR5 standard, in some embodiments, the address may be included in the command.

Figure 4:
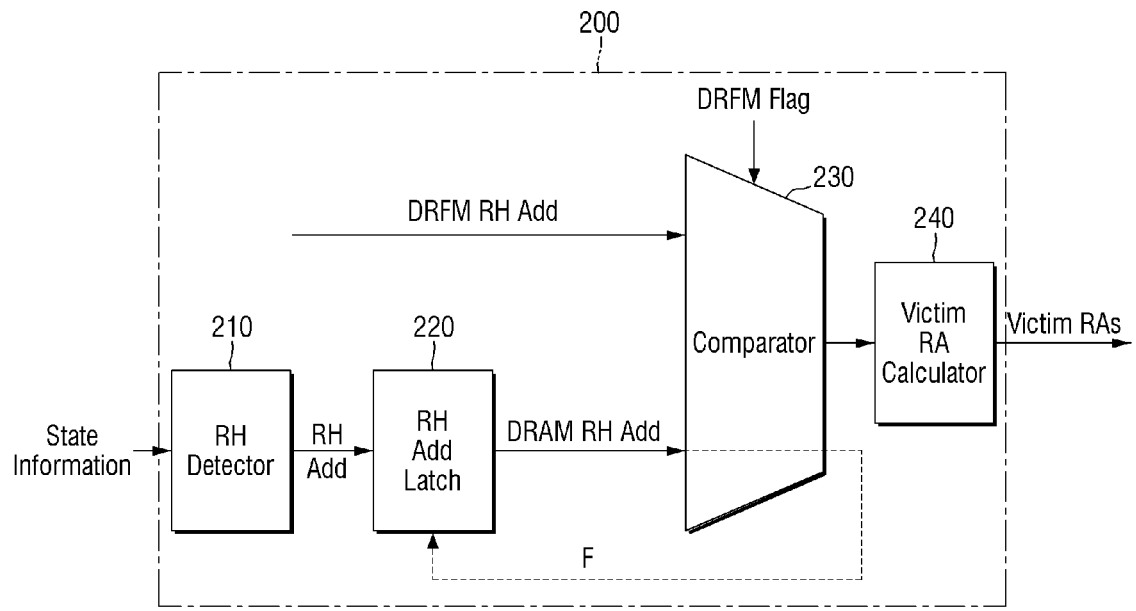
FIG. 4 is a diagram specifically illustrating a refresh controller according to some embodiments.

FIG. 4 is a diagram illustrating the refresh controller 200 according to some embodiments. Referring to FIG. 4, the refresh controller 200 may include a row-hammering (RH) detector 210, a row-hammering address (RH Add) latch 220, and a comparator 230.

The row-hammering (RH) detector 210 may monitor state information about each of the plurality of rows based on an activation level of each row in the bank row select circuit 140. The row-hammering detector 210 may determine whether to perform the internal refresh operation based on the state information about each row, and may output an internal row-hammering row address on which the internal refresh operation is to be performed.

According to some embodiments, the row-hammering detector 210 may receive the state information about each row based on the bank row select circuit 140 and may output a row-hammering address (RH Add) to the RH Add latch 220. Alternatively, according to some embodiments, the row-hammering detector 210 may receive the state information of each memory cell via the data input/output buffer 180.

According to some embodiments, the row-hammering address (RH Add) latch 220 may receive and store therein the internal row-hammering row address (RH Add) from the row-hammering detector 210. The row-hammering address latch 220 may either output the stored internal row-hammering row address (DRAM RH Add) to the comparator 230 or keep the stored internal row-hammering row address without outputting the same, depending on whether the comparator 230 is activated.

The comparator 230 may receive an external row-hammering address (DRFM RH Add) from the memory control logic 300 and the internal row-hammering row address (DRAM RH Add) from the row-hammering address latch 220. The comparator 230 may be activated upon receiving a refresh command flag (DRFM Flag) indicating that the refresh command has been received from the command decoder 310 (i.e., from the memory controller 20). As used with respect to the comparator 230, the term "activated" may mean that received inputs are compared with each other and a comparing result is outputted, while a term "not activated" may mean that a specified one among the received inputs is outputted without comparing the received inputs with each other.

According to some embodiments, when the comparator 230 is activated upon receiving the refresh command flag (DRFM Flag), the comparator 230 may compare the external row-hammering row address (DRFM RH Add) output from the memory control logic 300 with the internal row-hammering row (DRAM RH Add) output from the row-hammering address latch 220. For example, when the comparison result shows that the external row-hammering row address (DRFM RH Add) and the internal row-hammering row address (DRAM RH Add) are identical with each other, the comparator 230 outputs the external row-hammering row address (DRFM RH Add) and ignores the internal row-hammering row address (DRAM RH Add) by not feeding back the internal row-hammering row address (DRAM RH Add). Thus, the duplicate internal row-hammering row addresses (DRAM RH Add) stored in the row-hammering address latch 220 are deleted. In other words, when the comparison result shows that the external row-hammering row address (DRFM RH Add) and the internal row-hammering row address (DRAM RH Add) overlap with each other, the comparator 230 outputs the external row-hammering row address (DRFM RH Add) and ignores the internal row-hammering row address (DRAM RH Add) by not feeding DRAM RH Add back to the RH Add latch 220, deleting the duplicate internal row-hammering row addresses (DRAM RH Add).

For example, when the comparison result shows that the external row-hammering row address (DRFM RH Add) and the internal row-hammering row address (DRAM RH Add) are not identical with each other, the comparator 230 outputs the external row-hammering row address (DRFM RH Add) to perform the external refresh operation first, and then feeds back (F) the internal row-hammering row address (DRAM RH Add) to the row address latch 220 such that the internal row-hammering row address DRAM RH Add is kept/stored in the row-hammer address latch 220.

For example, when the comparator 230 is not activated based on the DRFM Flag, that is, when not receiving the refresh command from the memory controller 20, the comparator 230 may output the internal row-hammering row address (DRAM RH Add) and not feed the internal row-hammering row address (DRAM RH Add) back to the RH Add latch 220.

According to some embodiments, the refresh controller 200 may further include a victim row address (RA) calculator 240. When the victim row address calculator 240 receives the address of the row-hammering row from the comparator 230, the victim row address calculator 240 extracts the victim rows adjacent to the address of the row-hammering row where the row-hammering occurs.

The received row-hammering row address may be either the external row-hammering row address (DRFM RH Add) or the internal row-hammering row address (DRAM RH Add). The victim row address calculator 240 may extract, as the victim row addresses (Victim RAs), rows adjacent to the address of the row-hammering row in a preset range or in an arbitrary range around the address of the row-hammering row according to one embodiment.

According to some embodiments, the refresh controller 200 may be implemented in each bank row select circuit 140. In this case, the refresh controller 200 may be configured to control the bank row select circuit 140 to independently perform the refresh command on each bank. According to some embodiments, while a first bank row select circuit 140a performs an active operation based on an active command under control of the memory control logic 300, a second bank row select circuit 140b may perform an external refresh operation or an internal refresh operation under control of the refresh controller 200c. Further, according to some embodiments, the first bank row select circuit 140a may perform an external refresh operation under control of the refresh controller 200a, while the second bank row select circuit 140b may perform an internal refresh operation under control of the refresh controller 200a.

Figure 5:
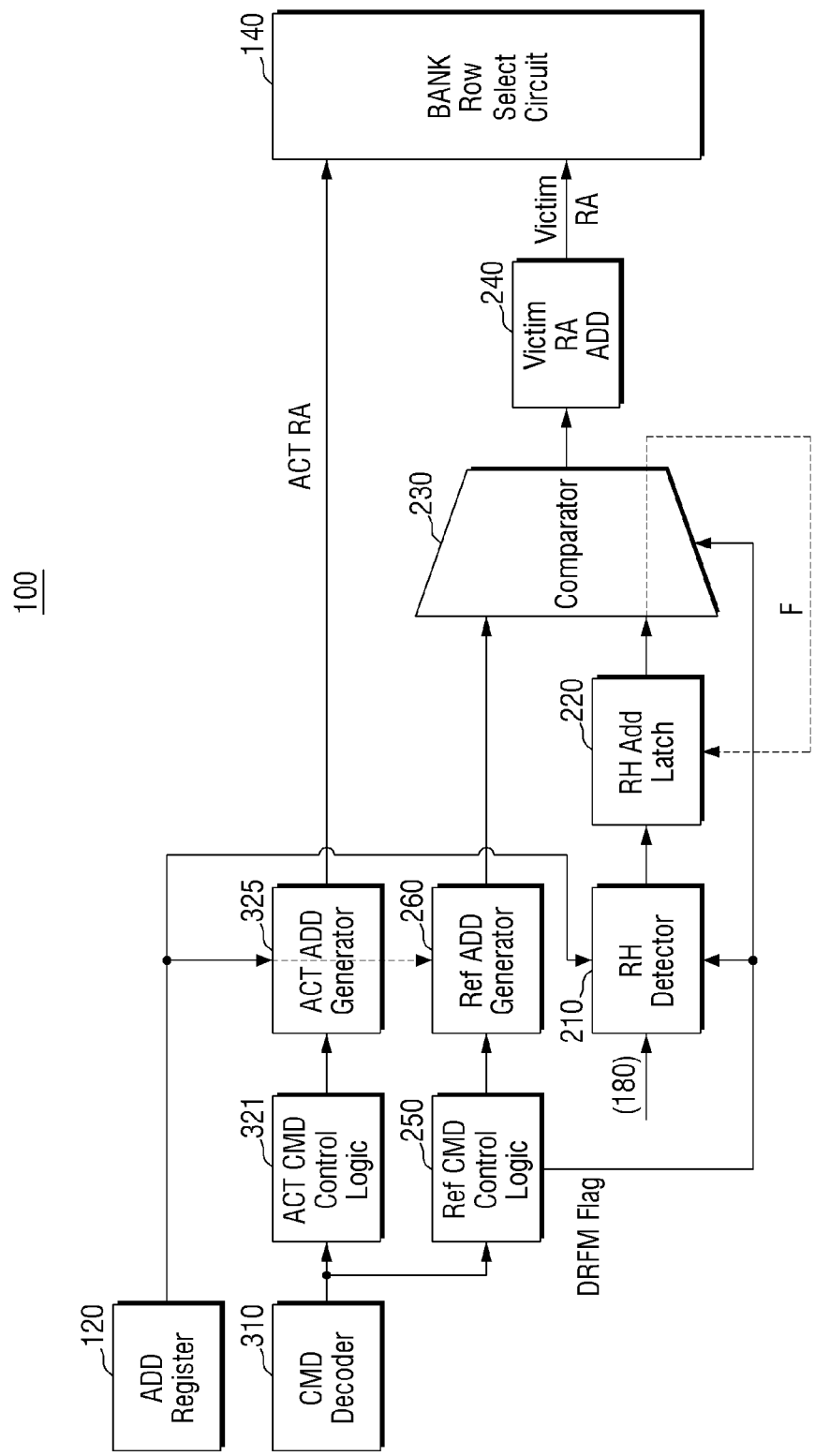
FIG. 5 is a diagram specifically illustrating a memory device according to some embodiments.

FIG. 5 is a diagram illustrating a memory device according to some embodiments.

Referring to FIG. 5, the memory device 100 may include the address register 120, the command (CMD) decoder 310, an active command (ACT CMD) control logic 321, an active address (ACT ADD) generator 325, a refresh command (Ref CMD) control logic 250, a refresh address (Ref ADD) generator 260, the row-hammering (RF) detector 210, the row-hammering address (RH Add) latch 220, the comparator 230, the victim row address (RA) calculator 240 and the bank row decoder 140. In the memory device 100 of FIG. 5, like components with the memory device 100 illustrated in FIGS. 3-4 are represented by like reference designators and repeated description thereof is omitted for conciseness.

According to some embodiments, all of the address (ADD) register 120, the command (CMD) decoder 310, the active command (ACT CMD) control logic 321, the active address (ACT ADD) generator 325, the refresh command (Ref CMD) control logic 250, the refresh address (Ref ADD) generator 260, the row-hammering (RH) detector 210, the row-hammering address (RH Add) latch 220, the comparator 230 and the victim row address (RA) calculator 240 may be implemented to be included in the memory control logic 300. Alternatively, according to some embodiments, the address (ADD) register 120, the command (CMD) decoder 310, the active command (ACT CMD) control logic 321, the active address (ACT ADD) generator 325, the refresh command (Ref CMD) control logic 250, the refresh address (Ref ADD) generator 260, the row-hammering (RH) detector 210, the row-hammering address (RH Add) latch 220, the comparator 230 and the victim row address (RA) calculator 240 may be included in the refresh controller 200 implemented separately from the memory control logic 300. According to some embodiments, the address (ADD) register 120 may be included in the memory control logic 300 or may be implemented separately therefrom.

The active command (ACT CMD) control logic 321 may be configured to control the bank row select circuit 140 to perform an active operation according to an active command (ACT CMD) among internal control commands output from the command (CMD) decoder 310.

The active address (ACT ADD) generator 325 receives the active command (ACT CMD) from the command (CMD) decoder 310 and active address information from the address (ADD) register 120, respectively, to generate an active address for an internal access. For example, the active address may include a bank address, a row address and a column address.

The refresh command (Ref CMD) control logic 250 receives the refresh command from the command decoder 310 and to controls the bank row select circuit 140 to perform the external refresh operation in response to the refresh command. For example, the refresh command control logic 250 may output the refresh command flag (DRFM Flag) to the comparator 230.

The refresh address (Ref ADD) generator 260 receives the refresh command from the memory controller 20 and refresh address information from the address register 120, respectively, to generate a refresh address for an internal access. For example, the refresh address may include a bank address, and a row-hammering row address. That is, the refresh command (Ref CMD) control logic 250 and the refresh address (Ref ADD) generator 260 may be configured for the external refresh operation.

The memory device 100 may include the row-hammering (RH) detector 210, the row-hammering address (RH Add) latch 220 and the comparator 230 for the internal refresh operation. The row-hammering detector 210 may monitor the external refresh operation or the internal refresh operation based on the refresh command flag (DRFM Flag). For example, when the row-hammering detector 210 receives the refresh command flag (DRFM Flag), the external refresh operation may be performed, and then, state information about the row-hammering row in which the refresh operation is performed may be reset. When the refresh command flag (DRFM Flag) is not activated because the row-hammering detector 210 does not receive the refresh command from the memory controller 20, the row-hammering detector 210 monitors the state information about the memory cell for the internal refresh operation, and determines whether to perform the internal refresh operation based on the monitoring result. Upon determination that the internal refresh operation is performed, the refresh operation may be executed.

The descriptions of the row-hammering (RH) detector 210, the row-hammering address (RH Add) latch 220, the comparator 230, and the victim row address (RA) calculator 240 are duplicates of those as described with reference to FIG. 4, and thus repeated descriptions thereof are omitted for conciseness.

Figure 6:
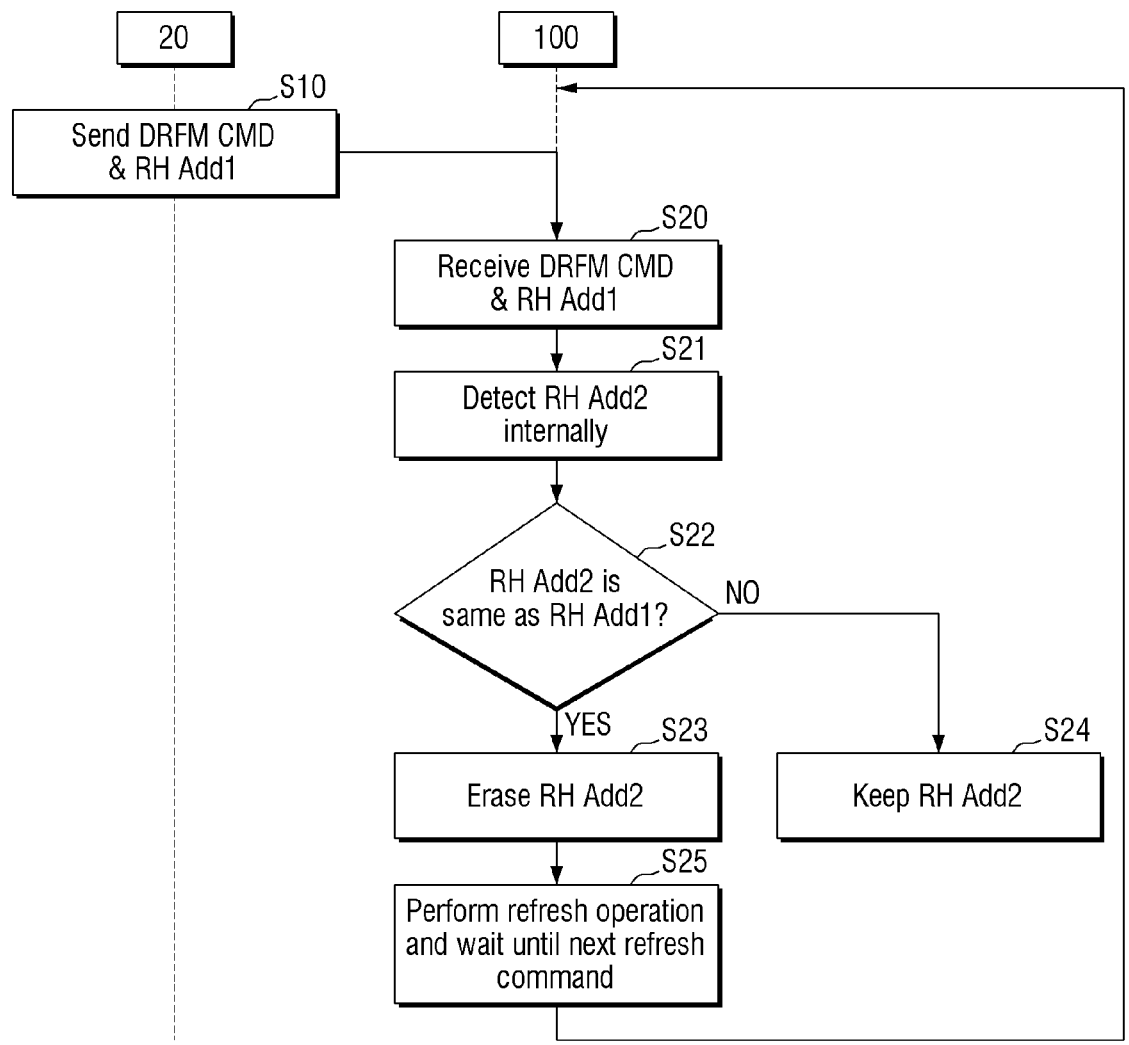
FIG. 6 is a flowchart for illustrating a method of operating a memory system according to some embodiments.

FIG. 6 is a flowchart for illustrating a method of operating a memory system according to some embodiments.

Referring to FIG. 6, the memory controller 20 sends the refresh command (DRFM CMD) and the refresh address information (RH Add1) in S10, and the memory device 100 receives the refresh command (DRFM CMD) and the refresh address information (RH Add1) in S20. The memory device 100 decodes the refresh command to extract the external refresh command and the external row-hammering row address RH Add1 therefrom.

The memory device 100 monitors itself and detects the internal row-hammering row address RH Add2 internally in S21. For example, the memory device 100 monitors itself and detects the internal row-hammering row address RH Add2 on which the internal refresh operation is to be executed, based on the memory cell state information, the number of accesses of the row decoder to a specific row address, etc. Hereinafter, for convenience of description, the external row-hammering row address related to the external refresh operation by the memory controller 20 is indicated as RH Add1, and the internal row-hammering row address of the memory device 100 itself is indicated as RH Add2.

Before performing the external refresh operation based on S10, the memory device 100 determines whether the internal row-hammering row address RH Add2 is the same as the external row-hammering row address RH Add1 in S22. For example, the memory device 100 compares the external row-hammering row address RH Add1 and the internal row-hammering row address RH Add2 with each other and thus checks whether both are duplicated or not based on the comparing result.

When the external row-hammering row address and the internal row-hammering row address are identical with each other (RH Add1=RH Add2) (S22, YES), the memory device 100 erases the internal row-hammering row address RH Add2 in S23. For example the memory device 100 calculates a victim row address based on the external row-hammering row address RH Add1 and deletes the internal row-hammering row address RH Add2 as a comparison target. To the contrary, when the external row-hammering row address RH Add1 and the internal row-hammering row address RH Add2 are not identical with each other (RH Add1≠RH Add2) (S22, NO), the memory device 100 keeps the internal row-hammering row address RH Add2 in S24. For example, the memory device 100 calculates the victim row address based on the external row-hammering row address RH Add1, and stores the internal row-hammering row address RH Add2 as the comparison target in the row-hammering address latch 220.

The memory device 100 may perform a refresh operation on the victim row address and may wait until reception of a next refresh command or active command in S25. Alternatively, the memory device 100 may monitor the memory cell state by itself while the active command is input thereto, and may detect the internal row-hammering row address RH Add2 based on the monitoring result, and may perform the internal refresh operation on the internal row-hammering row address RH Add according to a preset schedule.

Figure 7:
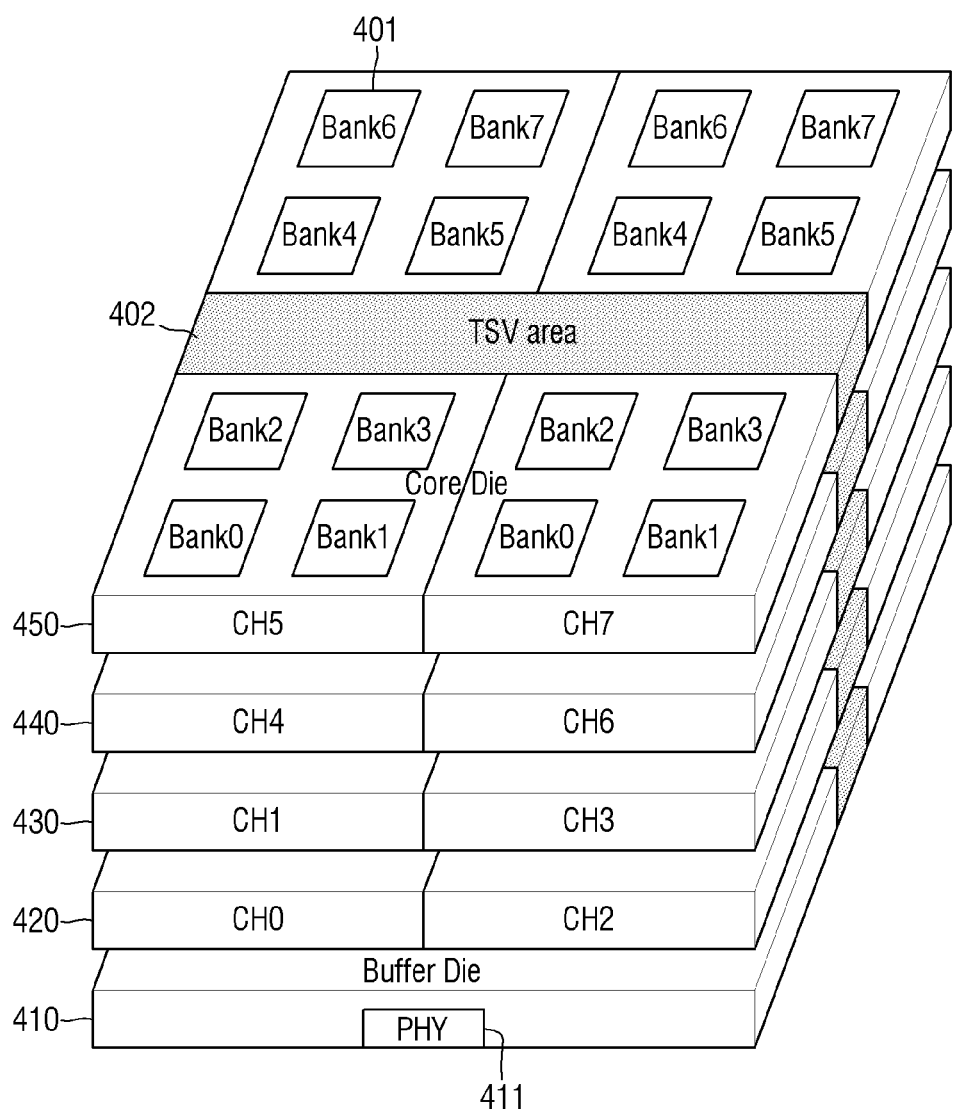
FIG. 7 is a block diagram showing a stack type memory device according to some embodiments.

FIG. 7 is a block diagram showing a stack type memory device according to embodiments.

Referring to FIG. 7, a stack type memory device 400 may include a buffer die 410 and a plurality of core dies 420 to 450. For example, the buffer die 410 may also be referred to as an interface die, a base die, a logic die, a master die, etc. Each of the core dies 420 to 450 may also be referred to as a memory die, a slave die, or the like. FIG. 7 shows that four core dies 420 to 450 are included in the stack type memory device 400. However, embodiments are not limited thereto and, in some embodiments, the number of the core dies may vary. For example, the stack type memory device 400 may include 8, 12 or 16 core dies.

The buffer die 410 and the core dies 420 to 450 may be stacked vertically and may be electrically connected to each other via TSVs (Through Silicon Vias) extending therethrough. Accordingly, the stack type memory device 400 may have a three-dimensional memory structure in which a plurality of dies 410 to 450 are stacked. For example, a stack type memory device 400 may be implemented based on a HBM or HMC standard.

The stack type memory device 400 may support a plurality of functionally independent channels (or vaults). For example, as shown in FIG. 7, the stack type memory device 400 may support 8 channels CH0 to CH7. When each of the channels CH0 to CH7 supports 128 data DQ delivery passages I/O, the stack type memory device 400 may support 1024 data delivery passages. However, embodiments are not limited thereto. The stack type memory device 400 may support 1024 or more data delivery passages, and 8 or more channels, for example, 16 channels. When the stack type memory device 400 supports 16 channels, each of the channels may support 64 data delivery passages.

Each of the core dies 420 to 450 may support at least one channel. For example, as shown in FIG. 7, the core dies 420 to 450 may respectively support 2 channels CH0 and CH2, 2 channels CH1 and CH3, 2 channels CH4 and CH6, and 2 channels CH5 and CH7. In this case, the core dies 420 to 450 may support different channels. However, embodiments are not limited thereto. At least two of the core dies 420 to 450 may support the same channel. For example, the core dies 420 to 450 may support the first channel CH0.

Each of the channels may constitute an independent command and data interface. For example, each channel may be independently clocked based on independent timing requirement, and the channels may not be synchronized with each other. For example, each channel may change a power state or perform refresh based on an independent command.

Each of the channels may include a plurality of memory banks 401. Each of the memory banks 401 may include memory cells connected to word-lines and bit-lines, a row select circuit, a column decoder, a sense amplifier, and the like. For example, as shown in FIG. 7, each of the channels CH0 to CH7 may include 8 memory banks 401. However, embodiments are not limited thereto. Each of the channels CH0 to CH7 may include 8 or more memory banks 401. FIG. 7 shows that the memory banks included in one channel are included in one core die. However, embodiments are not limited thereto. The memory banks included in one channel may be distributed across a plurality of core dies. For example, when the core dies 420 to 450 supports the first channel CH0, the memory banks included in the first channel CH0 may be distributed across the core dies 420 to 450.

In some embodiments, one channel may be divided into two pseudo-channels that operate independently. For example, the pseudo-channels may share a command and clock inputs (e.g., a clock signal CK and a clock enable signal CKE) of the channel, but decode and execute commands independently. For example, when one channel supports 128 data delivery passages, each of the pseudo channels may support 64 data delivery passages. For example, when one channel supports 64 data delivery passages, each of the pseudo channels may support 32 data delivery passages.

Each of the buffer die 410 and the core dies 420 to 450 may include a TSV area 402. The TSVs extending through the dies 410 to 450 may be disposed in the TSV area 402. The buffer die 410 may transmit/receive signals and/or data to/from the core die 420 to 450 via the TSVs. Each of the core dies 420 to 450 may transmit/receive signals and/or data to/from the buffer die 410 and another core die via the TSVs. In this case, the signals and/or the data may be independently transmitted/received via TSVs corresponding to each channel. For example, when the external host device transmits a command and an address to the first channel CH0 to access the memory cell of the first core die 420, the buffer die 410 may transmit control signals to the first core die 420 via the TSVs corresponding to the first channel CH0 to access the memory cell of the first channel CH0.

The buffer die 410 may include a physical layer PHY 411. The physical layer 411 may include interface circuits for communication with the external host device. For example, the physical layer 411 may include interface circuits corresponding to the memory device interface (I/F) 27 as described with reference to FIGS. 1 to 6. Signals and/or data received via the physical layer 411 may be transmitted to the core dies 420 to 450 via the TSVs.

In some embodiments, the buffer die 410 may include a channel controller corresponding to each of the channels. The channel controller may manage memory reference operations of a corresponding channel, and may determine a timing requirement of the corresponding channel.

In some embodiments, the buffer die 410 may include a plurality of pins for receiving signals from the external host device. The buffer die 410 may receive a clock signal CK, command/address signals C/A, a write data strobe signal WDQS, and a data signal DQ via the plurality of pins, and may transmit a read data strobe signal RDQS and the data signal DQ via the plurality of pins. For example, the buffer die 410 may include, on each channel basis, 2 pins for receiving the clock signal CK, 14 pins for receiving the command/address signals C/A, 8 pins for receiving the write data strobe signal WDQS, 8 pins for sending read data strobe signal RDQS, and 128 pins for sending and receiving data signal DQ.

Figure 8:
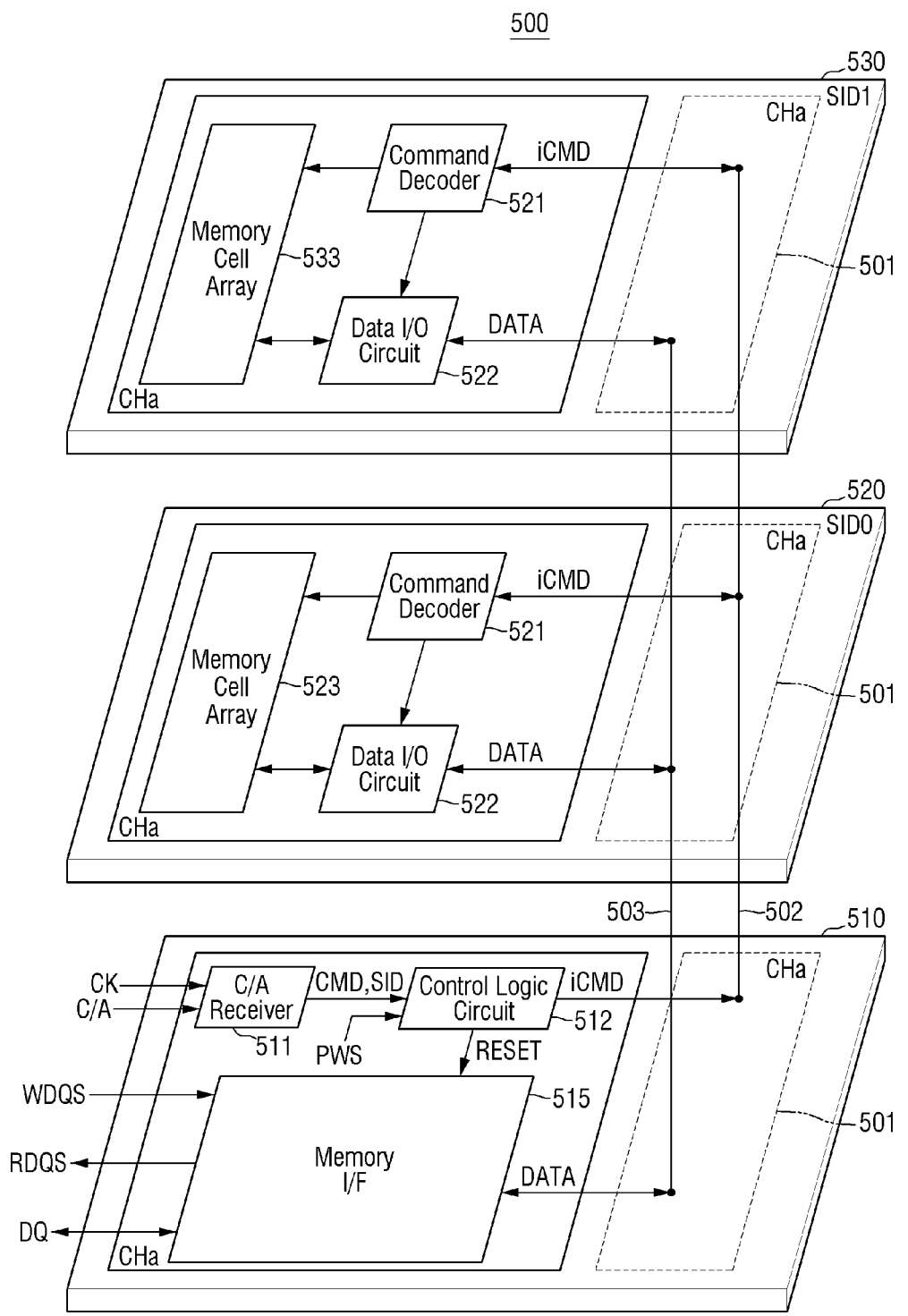
FIG. 8 is an exemplary block diagram of the stack type memory device of FIG. 7, according to some embodiments.

FIG. 8 is an exemplary block diagram of the stack type memory device of FIG. 7, according to some embodiments.

Referring to FIG. 8, a stack type memory device 500 may include a buffer die 510, a first core die 520, and a second core die 530. The first core die 520 and the second core die 530 may support the same channel CHa among the plurality of channels. In this case, the core dies 420 and 430 may be identified based on a stack ID SID. For example, the first core die 520 may correspond to a first stack ID SID0, and the second core die 530 may correspond to a second stack ID SID1. FIG. 8 shows that no core die is present between the first core die 520 and the second core die 530. However, embodiments are not limited thereto. Another core die may be located between the first core die 520 and the second core die 530.

The buffer die 510 and the core dies 520 and 530 may communicate with each other via TSVs 502 and 503 located in a TSV area 501. For example, the buffer die 510 may transmit an internal command iCMD to the first core die 520 and/or the second core die 530 via the TSV 502, and may transmit/receive data DATA to and from the first core die 520 and/or the second core die 530 via the TSV 503. FIG. 8 shows that the buffer die 510 communicates with the core dies 520 and 530 using the common TSVs 502 and 503. The disclosure is not limited thereto. The buffer die 510 may communicate with the core dies 520 and 530 using separate TSVs corresponding to the core dies 520 and 530, respectively.

The second core die 530 may include a command decoder 531, a data input/output circuit 532, and a memory cell array 533. The command decoder 531, the data input/output circuit 532, and the memory cell array 533 may respectively operate in substantially the same manner as a manner in which the command decoder 521, the data input/output circuit 522, and the memory cell array 523 of the first core die 520 operate.

A C/A receiver 511 may latch the command/address signals C/A based on a clock signal CK to receive the command CMD and the stack ID SID. The stack ID SID may be an address indicating at least one core die to identify core dies supporting the same channel. The command CMD and the stack ID SID as received may be provided to a control logic circuit 512.

The control logic circuit 512 may transmit an internal command iCMD to at least one of the first core die 520 and the second core die 530 based on the stack ID SID. For example, when the stack ID SID indicates the first stack ID SID0, the control logic circuit 512 may transmit the internal command iCMD to the first core die 520.

In some embodiments, as shown in FIG. 8, when the internal command iCMD and the data DATA are transmitted to the core dies 520 and 530 via the common TSVs 502 and 503, the buffer die 510 may transmit the stack ID SID to the core dies 520 and 530. The core dies 520 and 530 may decode the received stack ID SID and selectively receive internal command iCMD and the data DATA based on the decoding result. For example, when the stack ID SID indicates the first stack ID SID0, the first core die 520 may receive the internal command iCMD and the data DATA transmitted via the TSVs 520 and 530. In this case, the second core die 530 may not receive the internal command iCMD and the data DATA transmitted via the TSVs 520 and 530.

In another embodiment, when the internal command iCMD and the data DATA are transmitted to the core dies 520 and 530 via separate TSVs, respectively, the buffer die 510 may deliver the internal command iCMD and the data DATA to the core dies corresponding to the stack IDs SIDs via the separate TSVs, respectively.

As described above, when the core dies 520 and 530 support the same channel Cha, the stack type memory device 400 may perform a write operation and a read operation according to an active command or a refresh operation according to a refresh command, based on at least one of the first core die 520 and the second core die 530 according to the stack ID SID.

Figure 9:
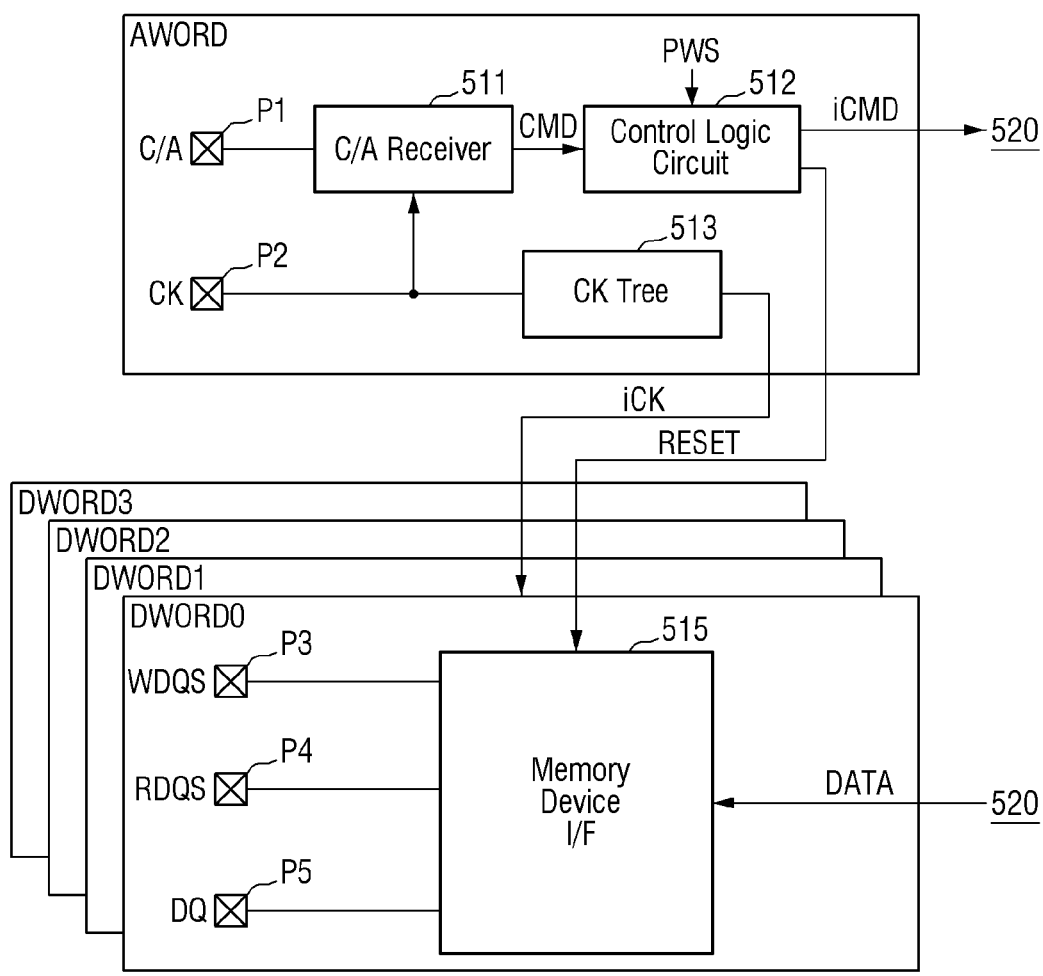
FIG. 9 is a block diagram showing an example of a buffer die of the stack type memory device of FIG. 8, according to some embodiments.

FIG. 9 is a block diagram showing an example of a buffer die of the stack type memory device of FIG. 8. Referring to FIG. 9, the buffer die 510 may include a command address input/output block AWORD and data input/output blocks DWORD0 to DWORD3.

In FIG. 9, an example in which the buffer die 510 includes 4 data input/output blocks DWORD0 to DWORD3 is described. However, embodiments are not limited thereto. The buffer die 510 may include various numbers of data input/output blocks. For example, the buffer die 510 may include two data input/output blocks.

The command address input/output block AWORD may include the C/A receiver 511, the control logic circuit 512, and a clock (CK) tree 516. The C/A receiver 511 may latch command/address signals C/A received from a P1 pad based on a clock signal CK received from a P2 pad to receive the command CMD. The control logic circuit 512 may generate a reset signal RESET based on the command CMD or power state information PWS, and transmit the reset signal RESET to each of the data input/output blocks DWORD0 to DWORD3. The control logic circuit 512 may generate the internal command iCMD according to the command CMD and transmit the internal command iCMD to the core die 520. The clock tree 516 may be composed of an inverter chain including multiple inverters. The internal clock signal iCK generated from the clock signal CK via the clock tree 516 may be transmitted to each of the data input/output blocks DWORD0 to DWORD3.

Each of the data input/output blocks DWORD0 to DWORD3 may receive the internal clock signal iCK and the reset signal RESET from the command address input/output block AWORD. Each of the data input/output blocks DWORD0 to DWORD3 may include a memory device interface 515. The memory device interface 515 is connected to each core die. The memory device interface 515 may transmit/receive, to/and from the core dies 520 and 530, the write data strobe signal WDQS via a P3 pad, the read data strobe signal RDQS via a P4 pad, and the data signal DQ via a P5 pad.

As described above, the P2 pad via which the clock signal CK is received is located in the command address input/output block AWORD. The P3 and P4 pads via which the write data strobe signal WDQS and the read data strobe signal RDQS are received, respectively may be located in the data input/output block DWORD. The clock signal CK received from the command address input/output block AWORD may be transferred to the data input/output block DWORD via the clock tree 516.

Figure 10:
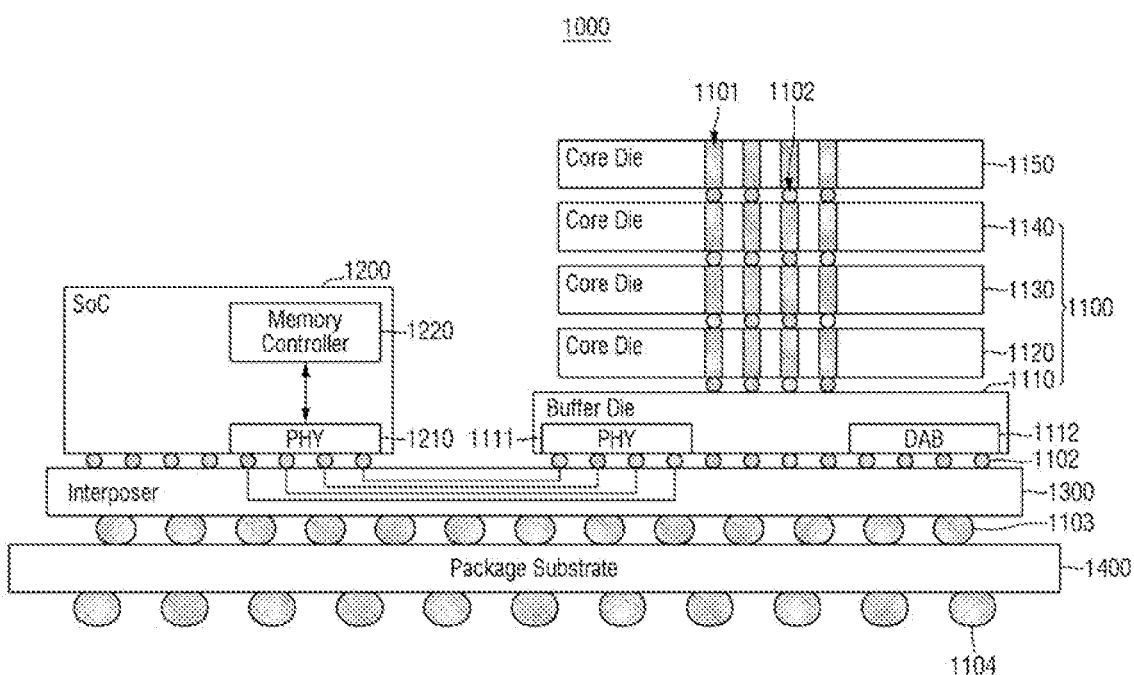
FIG. 10 is a diagram showing a semiconductor package according to some embodiments.

FIG. 10 is a diagram showing a semiconductor package according to some embodiments.

Referring to FIG. 10, a semiconductor package 1000 may include a stack type memory device 1100, a system on chip (SoC) 1200, an interposer 1300, and a package substrate 1400. The stack type memory device 1100 may include a buffer die 1110 and core dies 1120 to 1150. The buffer die 1110 may correspond to the buffer die 410 in FIG. 7. Each of the core dies 1120 to 1150 may correspond to each of the core dies 420 to 450 of FIG. 7.

Each of the core dies 1120 to 1150 may contain a memory cell array. The buffer die 1110 may include a physical layer 1111 and an direct access area (DAB) 1112. The physical layer 1111 may be electrically connected to a physical layer 1210 of the system on chip 1200 via the interposer 1300. The stack type memory device 1100 may receive signals from the system on chip 1200 via the physical layer 1111 or transmit signals to the system on chip 1200 via the physical layer 1111. The physical layer 1111 may include the interface circuits of the buffer die 510 as described with reference to FIG. 8.

The direct access area (DAB) 1112 may provide an access path for testing the stack type memory device 1100 without passing through the system on chip 1200. The direct access area 1112 may include conductive means (e.g., a port or a pin) that may communicate directly with the external test device. A test signal and data received through the direct access area 1112 may be transmitted to the core dies 1120 to 1150 via the TSVs. For testing of the core dies 1120 to 1150, data read-out from the core dies 1120 to 1150 may be transmitted to a test device via the TSVs and the direct access area 1112. Accordingly, a direct access test of the core dies 1120 to 1150 may be performed.

The buffer die 1110 and the core dies 1120 to 1150 may be electrically connected to each other via the TSVs 1101 and bumps 1102. The buffer die 1110 may receive signals provided to each channel from the system on chip 1200 via the bumps 1102 allocated to each channel. For example, the bumps 1102 may be embodied as micro bumps.

The system on chip (SoC) 1200 may execute applications supported by the semiconductor package 1000 using the stack type memory device 1100. For example, the system on chip 1200 may include at least one processor of CPU (Central Processing Unit), AP (Application Processor), GPU (Graphic Processing Unit), NPU (Neural Processing Unit), TPU (Tensor Processing Unit), VPU (Vision Processing Unit), ISP (Image Signal Processor), and DSP (Digital Signal Processor) to execute computing specialized therein.

The system on chip (SoC) 1200 may include the physical layer 1210 and a memory controller 1220. The physical layer 1210 may include input/output circuits for transmitting and receiving signals to and from the physical layer 1111 of the stack type memory device 1100. The system on chip 1200 may provide various signals to the physical layer 1111 via the physical layer 1210. The signals provided to the physical layer 1111 may be transmitted to the core dies 1120 to 1150 via the interface circuits of the physical layer 1111 and the TSVs 1101.

The memory controller 1220 may control all operations of the stack type memory device 1100. The memory controller 1220 may transmit signals for controlling the stack type memory device 1100 to the stack type memory device 1100 via the physical layer 1210. The memory controller 1220 may correspond to the memory controller 20 in FIG. 1.

The interposer 1300 may connect the stack type memory device 1100 and the system on chip 1200 to each other. The interposer 1300 may be connected to the physical layer 1111 of the stack type memory device 1100 and the physical layer 1210 of the system on chip 1200 and may provide physical paths made of a conductive material. Accordingly, the stack type memory device 1100 and the system on chip 1200 may be stacked on the interposer 1300 and thus transmit and receive signals to and from each other via the interposer 1300.

Bumps 1103 may be attached to a top of the package substrate 1400. Solder balls 1104 may be attached to a bottom of the package substrate 1400. For example, the bumps 1103 may be embodied as flip-chip bumps. The interposer 1300 may be stacked on the package substrate 1400 via the bumps 1103. The semiconductor package 1000 may transmit and receive signals to and from other external packages or semiconductor devices via the solder balls 1104. For example, the package substrate 1400 may be embodied as a printed circuit board (PCB).

Figure 11:
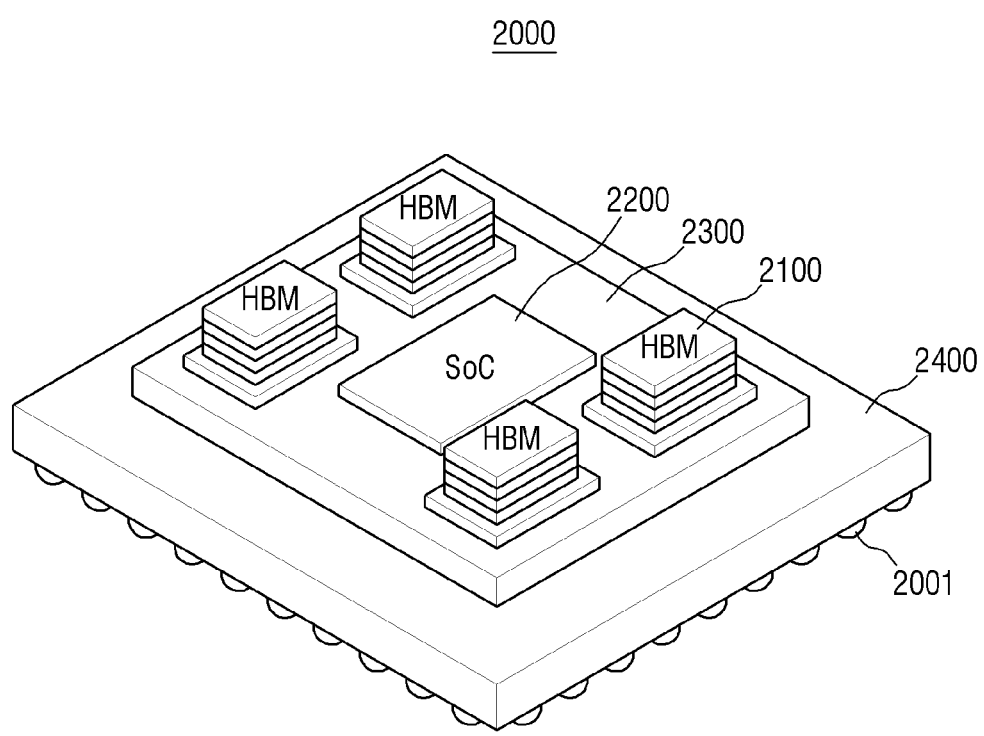
FIG. 11 is a diagram showing an example of implementation of a semiconductor package according to an embodiment.

FIG. 11 is a diagram showing an example of implementation of a semiconductor package according to an embodiment.

Referring to FIG. 11, a semiconductor package 2000 may include a plurality of stack type memory devices 2100 and a system on chip (SoC) 2200. The stack type memory devices 2100 and the system on chip 2200 may be stacked on the interposer 2300. The interposer 2300 may be stacked on a package substrate 2400. The semiconductor package 2000 may transmit and receive signals to and from other external packages or semiconductor devices via solder balls 2001 attached to a bottom of the package substrate 2400.

Each of the stack type memory devices 2100 may be implemented based on a HBM standard. However, the present disclosure is not limited thereto. Each of the stack type memory devices 2100 may be implemented based on a GDDR, HMC, or Wide I/O standard. Each of the stack type memory devices 2100 may correspond to the stack type memory device 3000 of FIG. 11.

The system on chip 2200 may include at least one processor such as a CPU, an AP, a GPU, and an NPU and a plurality of memory controllers for controlling a plurality of stack type memory devices 2100. The system on chip 2200 may transmit and receive signals to and from each stack type memory device via each memory controller. The system on chip 2200 may correspond to the system on chip 1200 in FIG. 10.

Figure 12:
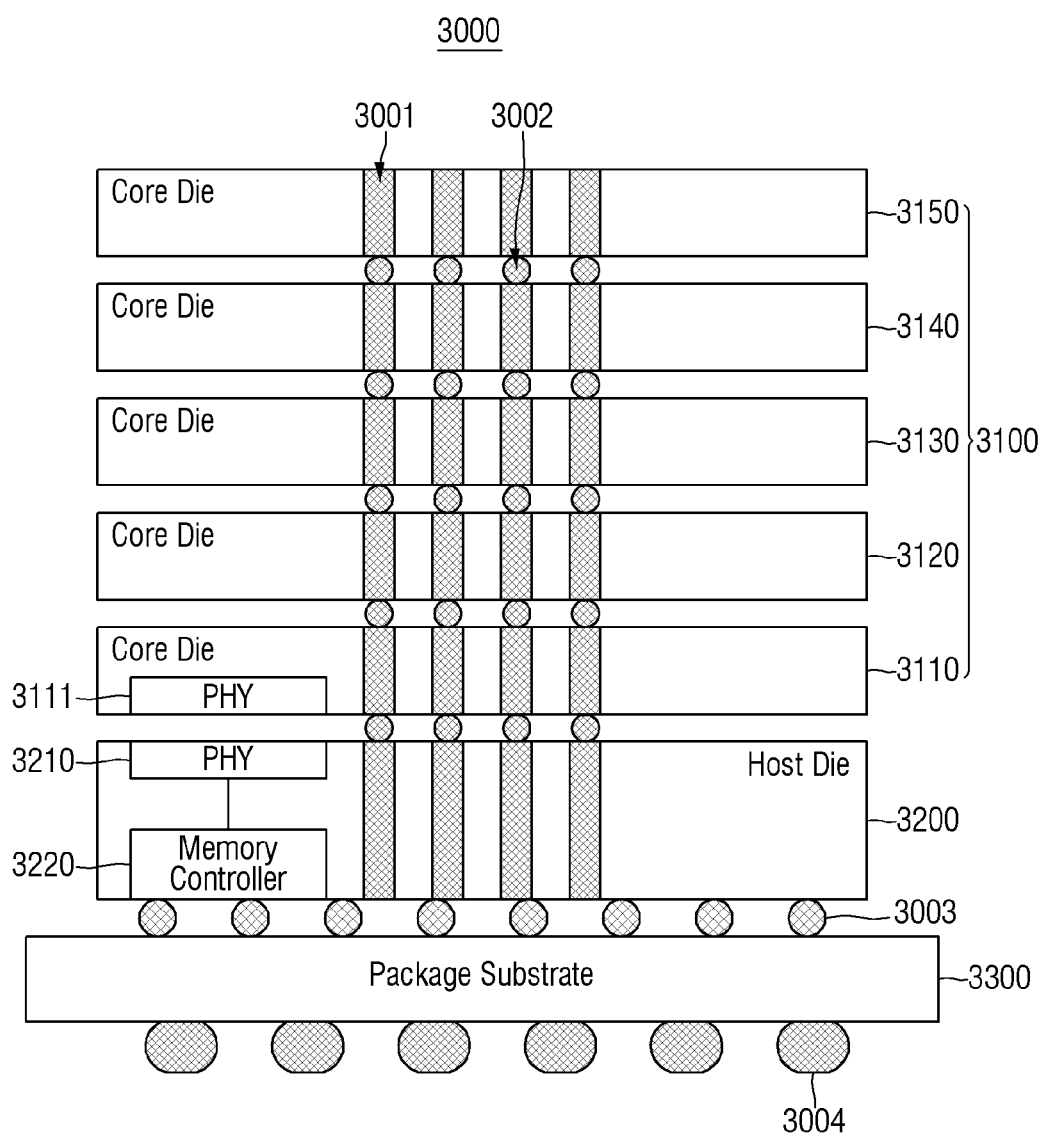
FIG. 12 is a diagram showing a semiconductor package according to some embodiments.

FIG. 12 is a diagram showing a semiconductor package according to some embodiments.

Referring to FIG. 12, a semiconductor package 3000 may include a stack type memory device 3100, a host die 3200, and a package substrate 3300. The stack type memory device 3100 may include a buffer die 3110 and core dies 3120 to 3150. The buffer die 3110 includes a physical layer 3111 for communicating with a host die 3200, and each of the core dies 3120 to 3150 may include a memory cell array. The stack type memory device 3100 may correspond to each of the stack type memory devices 1000 and 2000 of FIG. 10 and FIG. 11.

The host die 3200 may include a physical layer 3210 to communicate with the stack type memory device 3100 and a memory controller 3220 to control all operations of the stack type memory device 3100. Further, the host die 3200 may control all operations of the semiconductor package 3000 and may include a processor for executing applications supported by the semiconductor package 3000. For example, the host die 3200 may include at least one processor such as CPU, AP, GPU, and NPU.

The stack type memory device 3100 may be disposed on the host die 3200 based on TSVs 3001 and may be vertically stacked on the host die 3200. Accordingly, the buffer die 3110, the core dies 3120 to 3150, and the host die 3200 may be electrically connected to each other via the TSVs 3001 and bumps 3002 without an interposer. For example, the bumps 3002 may be embodied as micro bumps.

Bumps 3003 may be attached to a top of the package substrate 3300, while solder balls 3004 may be attached to a bottom of the package substrate 3300. For example, the bumps 3003 may be embodied as flip-chip bumps. The host die 3200 may be stacked on the package substrate 3300 via the bumps 3003. The semiconductor package 3000 may transmit and receive signals to and from other external packages or semiconductor devices via the solder balls 3004.

In another embodiment, the stack type memory device 3100 may be implemented only with the core dies 3120 to 3150 and may be free of the buffer die 3110. In this case, each of the core dies 3120 to 3250 may include interface circuits for communicating with the host die 3200. Each of the core dies 3120 to 3250 may transmit/receive signals to and from the host die 3200 via the TSVs 3001.

Although various embodiments have been described above with reference to the accompanying drawings, a person with ordinary skill in the technical field to which the present disclosure belongs will appreciate that the present disclosure will be implemented in another specific form without changing technical idea or essential characteristics thereof. Therefore, it should be understood that the embodiments as described above are illustrative in all respects and not restrictive.

What is claimed is:

1. A memory device comprising:
a memory cell array including a plurality of memory cells arranged in a plurality of rows and a plurality of columns;
a row select circuit connected to the plurality of rows;
a refresh controller configured to control the row select circuit to apply a refresh operating voltage to at least one row; and
a memory control logic configured to decode a command received from a memory controller and to output a refresh command and external refresh address information,
wherein the refresh controller controls the row select circuit to perform one of an external refresh operation and an internal refresh operation, based on the refresh command that is output from the memory controller and based on whether a first row-hammering row address of the internal refresh operation is identical with a second row-hammering row address of the external refresh operation.

2. The memory device of claim 1, wherein the refresh controller includes:
a row-hammering detector that monitors whether to perform the internal refresh operation on each of the plurality of rows, based on an activation level of each row in the row select circuit; and
a comparator that determines whether the first row-hammering row address of the internal refresh operation is identical with the second row-hammering row address of the external refresh operation.

3. The memory device of claim 2, wherein when the memory control logic receives the refresh command from the memory controller, the comparator is activated to compare the first row-hammering row address with the second row-hammering row address.

4. The memory device of claim 2, wherein when the memory control logic does not receive the refresh command from the memory controller, the comparator outputs the first row-hammering row address.

5. The memory device of claim 3, wherein when the first row-hammering row address is identical with the second row-hammering row address, the comparator outputs the second row-hammering row address and ignores the first row-hammering row address.

6. The memory device of claim 3, wherein when the first row-hammering row address is not identical with the second row-hammering row address, the comparator outputs the second row-hammering row address and stores the first row-hammering row address in a row-hammering address latch.

7. The memory device of claim 6, wherein the row-hammering address latch is connected to and disposed between the row-hammering detector and one input of the comparator, and the row-hammering address latch stores the first row-hammering row address.

8. A memory device comprising:
a bank array including memory cells;
a bank row select circuit that applies an operating voltage to each of rows of the bank array; and
a memory control logic configured to control the operating voltage,
wherein the memory control logic is configured to:
determine whether to perform an internal refresh operation, and detect an internal row-hammering row address, based on operation information about each of the rows; and
when refresh address information and a refresh command is received from a memory controller, compare an external row-hammering row address based on the refresh address information with the internal row-hammering row address and, when the external row-hammering row address is identical with the internal row-hammering row address, control the bank row select circuit to perform an external refresh operation according to the refresh command, based on the external row-hammering row address.

9. The memory device of claim 8, wherein when the external row-hammering row address is not identical with the internal row-hammering row address, the memory control logic is configured to store the internal row-hammering row address in a row-hammering address latch.

10. The memory device of claim 8, wherein the memory control logic is further configured to extract at least one victim row address adjacent to the external row-hammering row address or adjacent to the internal row-hammering row address; and perform the external refresh operation or the internal refresh operation on the at least one victim row address.

11. The memory device of claim 8, wherein when the memory control logic does not receive the refresh address information and the refresh command from the memory controller, the memory control logic is further configured to perform the internal refresh operation based on the internal row-hammering row address.

12. The memory device of claim 8, wherein the bank array includes a plurality of bank arrays, and the bank row select circuit includes a plurality of bank row select circuits corresponding to the plurality of bank arrays, respectively, wherein the memory control logic is further configured to perform the external refresh operation or the internal refresh operation on each of the plurality of bank arrays independently.

13. A memory device comprising:

a plurality of bank arrays;

a plurality of bank row select circuits connected to the plurality of bank arrays, respectively, wherein each of the plurality of bank row select circuits is connected to a corresponding bank array on a row basis and applies an operation voltage thereto; and a memory control logic configured to control the applied operating voltage based on commands from a memory controller or based on an internal operation result of the memory control logic, wherein when an external row-hammering row address on which an external refresh operation is to be performed based on a refresh command among the commands is identical with an internal row-hammering row address on which an internal refresh operation is to be performed based on the internal operation result of the memory control logic, the memory control logic is configured to perform only the external refresh operation.

14. The memory device of claim 13, wherein the memory control logic includes:

a command decoder that receives a command from the memory controller and decodes the command into an internal operation command;

an address register that receives address information from the memory controller and converts the address information into address information about each of the plurality of bank arrays; and a refresh controller configured to control performing of the external refresh operation or the internal refresh operation.

15. The memory device of claim 14, wherein the refresh controller includes a plurality of refresh controllers respectively connected to the plurality of bank row select circuits, wherein each of the plurality of refresh controllers includes:

a row-hammering detector that monitors state information about each row of each of the plurality of bank arrays and detects the internal row-hammering row address based on the monitoring result;

a row-hammering address latch that stores the internal row-hammering row address; and a comparator that compares the internal row-hammering row address with the external row-hammering row address received from the address register.

16. The memory device of claim 15, wherein when the comparator receives the refresh command from the memory controller, the comparator compares the external row-hammering row address with the internal row-hammering row address, wherein when the external row-hammering row address is identical with the internal row-hammering row address, the comparator outputs the external row-hammering row address.

17. The memory device of claim 15, wherein when the comparator does not receive the refresh command from the memory controller, the comparator outputs the internal row-hammering row address that is stored in the row-hammering address latch.

18. The memory device of claim 13, wherein the memory control logic is further configured to:

extract at least one victim row address adjacent to the external row-hammering row address or the internal row-hammering row address; and perform the external refresh operation or the internal refresh operation on the at least one victim row address.

19. The memory device of claim 13, wherein the memory controller is configured to:

determine, based on the commands and the address information transmitted to the memory device, whether a row-hammering phenomenon occurs; and transmit the refresh command and the address information to the memory device based on the determination result.

20. The memory device of claim 19, wherein the memory controller is further configured to:

receive information about the internal row-hammering row address on which the internal refresh operation is to be performed; and determine whether to transmit the refresh command, based on the information about the internal row-hammering row address.

* * * * *